US010957781B2

(12) United States Patent
Belyansky et al.

(10) Patent No.: US 10,957,781 B2
(45) Date of Patent: Mar. 23, 2021

(54) UNIFORM HORIZONTAL SPACER

(71) Applicant: INTERNATIONAL BUSINESS MACHINES CORPORATION, Armonk, NY (US)

(72) Inventors: Michael P. Belyansky, Halfmoon, NY (US); Oleg Gluschenkov, Tannersville, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/049,930

(22) Filed: Jul. 31, 2018

(65) Prior Publication Data
US 2020/0044054 A1    Feb. 6, 2020

(51) Int. Cl.
H01L 27/088    (2006.01)
H01L 29/66     (2006.01)
H01L 21/02     (2006.01)
H01L 29/06     (2006.01)
H01L 21/8238   (2006.01)
H01L 27/092    (2006.01)
H01L 21/311    (2006.01)

(52) U.S. Cl.
CPC .... H01L 29/66553 (2013.01); H01L 21/0217 (2013.01); H01L 21/02164 (2013.01); H01L 21/02266 (2013.01); H01L 21/02274 (2013.01); H01L 21/823885 (2013.01); H01L 27/092 (2013.01); H01L 29/0653 (2013.01); H01L 29/66666 (2013.01); H01L 21/31105 (2013.01)

(58) Field of Classification Search
None
See application file for complete search history.

(56) References Cited

U.S. PATENT DOCUMENTS

| | | |
|---|---|---|
| 5,872,058 A | 2/1999 | Van Cleemput et al. |
| 6,376,873 B1 | 4/2002 | Furukawa et al. |
| 6,395,150 B1 | 5/2002 | Van Cleemput et al. |
| 9,502,519 B2 | 11/2016 | Chen et al. |
| 9,601,491 B1 * | 3/2017 | Mallela ............... H01L 27/0924 |
| 9,627,511 B1 | 4/2017 | Cheng et al. |
| 9,741,626 B1 | 8/2017 | Cheng et al. |
| 9,748,359 B1 | 8/2017 | Gluschenkov et al. |
| 9,773,901 B1 | 9/2017 | Gluschenkov et al. |
| 9,799,749 B1 | 10/2017 | Bi et al. |
| 9,859,388 B1 | 1/2018 | Cheng et al. |
| 9,870,957 B2 | 1/2018 | Jeong et al. |

(Continued)

Primary Examiner — Joseph C. Nicely
Assistant Examiner — Lamont B Koo
(74) Attorney, Agent, or Firm — Tutunjian & Bitetto, P.C.; Douglas Pearson

(57) ABSTRACT

In accordance with an embodiment of the present invention, a method and semiconductor device is described, including forming a plurality of gaps of variable size between device features, each of the gaps including vertical sidewalls perpendicular to a substrate surface and a horizontal surface parallel to the substrate surface. Spacer material is directionally deposited concurrently on the horizontal surface in each gap and in a flat area using a total flow rate of gaseous precursors that minimizes gap-loading in a smallest gap compared to the flat area such that the spacer material is deposited on the substrate surface in each gap and in the flat area to a uniform thickness.

17 Claims, 7 Drawing Sheets

(56) References Cited

U.S. PATENT DOCUMENTS

| | | | |
|---|---|---|---|
| 2003/0213562 A1* | 11/2003 | Gondhalekar | C23C 16/4401 |
| | | | 156/345.48 |
| 2011/0068431 A1* | 3/2011 | Knorr | H01L 29/66795 |
| | | | 257/506 |
| 2012/0121823 A1* | 5/2012 | Chhabra | C23C 8/10 |
| | | | 427/585 |
| 2015/0108572 A1* | 4/2015 | Cheng | H01L 21/845 |
| | | | 257/347 |
| 2016/0064541 A1 | 3/2016 | Diaz et al. | |
| 2017/0229556 A1 | 8/2017 | Anderson et al. | |
| 2017/0250106 A1* | 8/2017 | Lin | H01L 29/66795 |
| 2019/0067451 A1* | 2/2019 | Ching | H01L 21/8239 |
| 2019/0214307 A1* | 7/2019 | Xie | H01L 21/823487 |

* cited by examiner

```
┌─────────────────────────────────────────────────────────────────────┐
│ Form a plurality of gaps of variable size between device features,  │
│ each of the gaps including vertical sidewalls perpendicular to a    │
│ substrate surface and a horizontal surface parallel to the          │
│ substrate surface.                                                  │
│                             1201                                    │
└─────────────────────────────────────────────────────────────────────┘
                                  │
                                  ▼
┌─────────────────────────────────────────────────────────────────────┐
│ Directionally deposit spacer material concurrently on the           │
│ horizontal surface in each gap and in a flat area using a total     │
│ flow rate of gaseous precursors that minimizes gap-loading such     │
│ that the spacer material is deposited on the substrate surface in   │
│ each gap and in the flat area to a uniform thickness.               │
│                             1202                                    │
└─────────────────────────────────────────────────────────────────────┘
                                  │
                                  ▼
┌─────────────────────────────────────────────────────────────────────┐
│ Isotropically etch the spacer material to remove spacer material    │
│ from the sidewalls.                                                 │
│                             1203                                    │
└─────────────────────────────────────────────────────────────────────┘
                                  │
                                  ▼
┌─────────────────────────────────────────────────────────────────────┐
│ Form a gate structure over the horizontal spacer and to form at     │
│ least one transistor                                                │
│                             1204                                    │
└─────────────────────────────────────────────────────────────────────┘
```

FIG. 8

UNIFORM HORIZONTAL SPACER

BACKGROUND

Technical Field

The present invention generally relates to horizontal spacers, and more particularly to uniform horizontal spacers with minimal gap loading.

Description of the Related Art

Horizontal spacers are structures where spacer material is formed on horizontal surfaces and are absent on vertical surfaces or sidewalls. Horizontal spacers are useful for vertical field effect transistor (VFET) where the channel is oriented vertically or perpendicular to the substrate such that various structural elements need to be separated vertically. Similar to sidewall vertical spacers, the thickness of horizontal spacers is preferably kept small to ensure the overall structure compactness and adequate transistor performance, but not so small as to cause an electrical short. Thus, the spacer thickness control is paramount for an adequate transistor performance and its long-term reliability.

However, some devices, such as, e.g., three dimensional transistors including VFETs, can have a different pitches of transistors for varying transistor size for different circuit functions. Such devices have gaps of varying size between the features. Varying gap sizes on a scale below hundreds of nanometers can affect an amount of material deposited within the gap if a non-conformal deposition process is used, such as high density plasma (HDP) deposition or spin-on deposition. This results in horizontal spacers with non-uniform thicknesses, such as causing gap-loading in smaller sized gaps. In fact, the narrower a gap size, the thicker the horizontal spacer will be, thus causing the gap-loading except where the gap is so small that gaseous precursors including radicals and ions cannot enter the gap opening. This can result in the horizontal spacer material of the small gaps being too thick, or the horizontal spacer material in the open of flat areas being deposited at such a low thickness the open or flat areas as to result in the electrical short.

SUMMARY

In accordance with an embodiment of the present invention, a method for forming a semiconductor device is described. The method includes forming a plurality of gaps of variable size between device features, each of the gaps including vertical sidewalls perpendicular to a substrate surface and a horizontal surface parallel to the substrate surface. Spacer material is directionally deposited concurrently on the horizontal surface in each gap and in a flat area using a total flow rate of gaseous precursors that minimizes gap-loading in a smallest gap compared to the flat area such that the spacer material is deposited on the substrate surface in each gap and in the flat area to a uniform thickness.

In accordance with another embodiment of the present invention, a method for forming a semiconductor device is described. The method includes forming a plurality of fins on a substrate such that gaps are formed between each fin, the gaps having varying sizes. Spacer material is directionally deposited concurrently on a surface of the substrate in each gap and in a flat area using non-conformal bottom-up deposition using a flow rate of gaseous precursors that minimizes gap-loading in the smallest gap compared to the flat area such that the spacer material is deposited on the surface in each gap and in the flat area to a uniform thickness. The spacer material is isotropically etched from vertical sidewalls of the fins, wherein the vertical sidewalls are perpendicular to the surface of the substrate. A vertical gate structure is formed on each of the fins to form at least one vertical transistor.

In accordance with another embodiment of the present invention, a semiconductor device is described. The semiconductor device includes fins formed on a surface of a substrate, the fins having sidewalls perpendicular to the surface. Gaps are disposed between each fin, the gaps having variable sizes corresponding to areas on the surface of the substrate outside of the fins. Horizontal spacers are disposed on the surface of the substrate in each of the gaps and in a flat area such that the horizontal spacers are of such uniformity in thickness in each of the gaps as to prevent transistor threshold voltage shift by more than about 20 mV and transistor on resistance increase by more than about 5%. A gate structure is disposed across the fins and over the horizontal spacers to form transistors.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 8 is a block/flow diagram showing a system/method for forming uniform thickness horizontal spacers in gaps of a variable pitch and open or flat areas for a semiconductor device, in accordance with an embodiment of the present invention.

DETAILED DESCRIPTION

Figure 1:
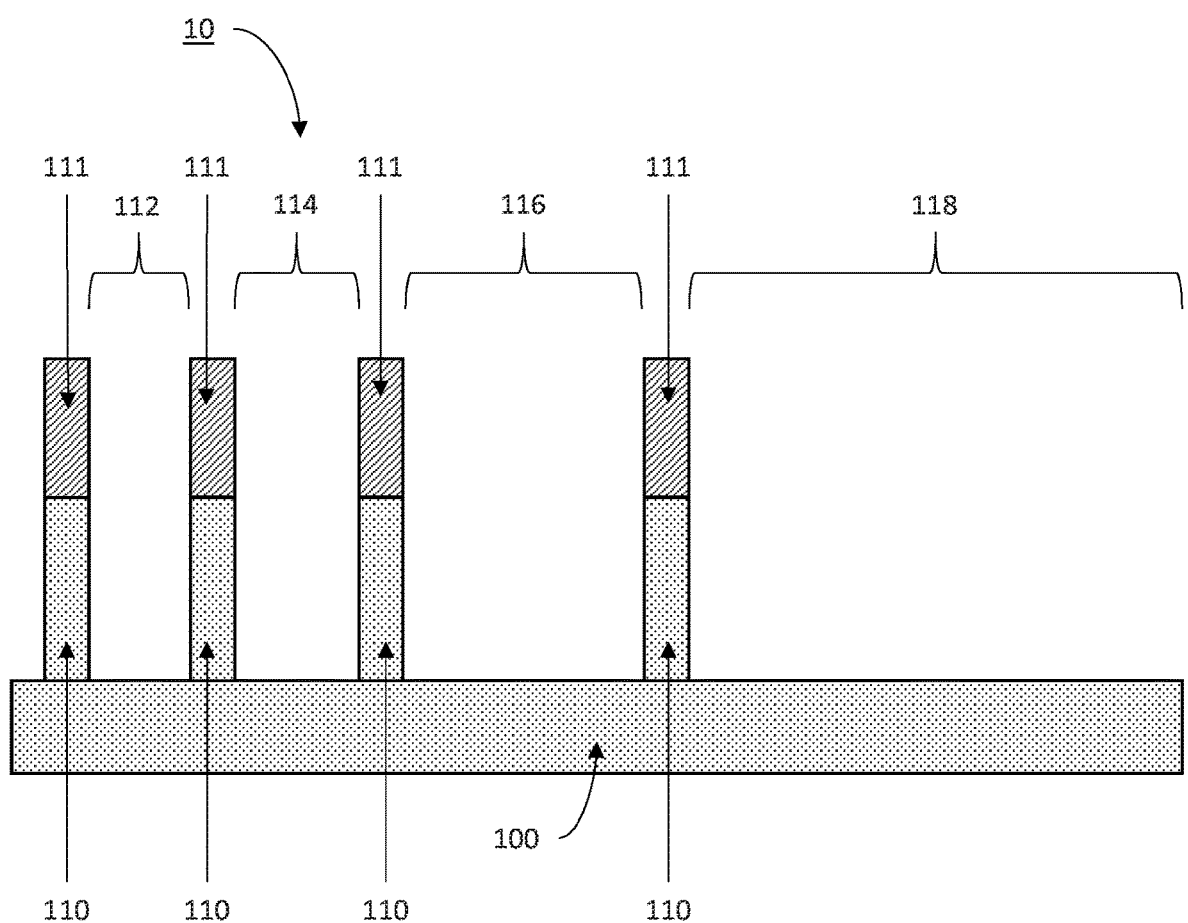
FIG. 1 is a cross-sectional view showing a semiconductor device having features of variable pitch and open or flat areas, in accordance with an embodiment of the present invention.

An exemplary embodiment according to aspects of the present invention includes a high-density plasma (HDP) chemical vapor deposition (CVD) process on a semiconductor device having variable pitch structures including open or flat areas.

HDP CVD apparatus is an electrical discharge device that ionizes low-pressure process gases creating and sustaining high-density gaseous plasma allowing for a plasma-assisted chemical vapor deposition onto substrates placed inside such apparatus. The process gases or gaseous precursors are delivered into the process chamber through gas inlets and their respective gas flows are precisely and independently controlled by mass flow control (MFC) devices supplying a predetermined amount of gas molecules per minute. It is customary to measure the gas flow rate in standard cubic centimeters per minute (sccm) or standard liters per minute (slm) where each standard cubic centimeter or standard liter contains $2.69 \times 10^{19}$ or $2.69 \times 10^{22}$ gaseous molecules, respectively.

The gases are pumped out from the chamber using a turbomolecular pump connected through a throttle valve. The throttle valve regulates the speed of pumping and allows for maintaining a target chamber pressure for various gas flow rates. The chamber pressure is measured using a capacitive manometer and the position of throttle valve is electronically adjusted based on the manometer reading to keep the chamber pressure constant. Accordingly, increasing the total gas flow rate (the sum of flow rates for all input gases) leads to an increased gas molecule drift velocity while the chamber pressure remains constant at the specified level. The range of chamber pressure is from about 5 mTorr to about 100 mTorr. The electrical power is delivered into gaseous plasma using radiofrequency (RF) or microwave remote coupling schemes such as an inductive coupling through dielectric windows. This allows for creating a higher degree of gas ionization and a higher density of plasma electrons of from about $10^{11}$ to about $10^{13}$ cm$^{-3}$ while maintaining a low ion energy.

The substrate on which a film will be deposited is placed onto an electrostatic chuck inside the plasma chamber. The electrostatic chuck clamps the substrate. The chuck with the attached substrate can be immersed into the high density plasma or, alternatively, positioned at some distance from the plasma peak density reducing its exposure to high density plasma. The plasma ions can be selectively and independently accelerated toward the substrate using a separate electrical bias system. The substrate bias system may employ RF or pulsed bias. The substrate bias can be specified in volts or, alternatively, in watts, if the apparatus employs RF bias. Gaseous precursors passing through the high density plasma are broken down into chemically active radicals. The radicals diffuse or drift toward the substrate supporting the growth of high-quality films at a low substrate temperature. The substrate bias allows for inducing a sputtering component as well as the ion implantation into growing film.

Both sputtering and implantation components possess directional property due to ions accelerating toward substrate. Increasing substrate bias can lead to an increased sputtering component. The film growth rate is determined by competing additive (e.g. radical assisted deposition, ion implantation) and subtractive (e.g. sputtering, radical assisted desorption or etching) processes. Increasing plasma density through a higher electrical power coupled into the plasma can lead to an increased growth rate due to a higher rate of producing radicals in the plasma.

Placing substrate in the proximity of high density plasma can lead to an increased growth rate. High growth rates are not always desirable as in the case of growing thin films (e.g. films with the thickness of less than 20 nm). In this case, the substrate can be placed away from the high density plasma region and/or the power delivered to the plasma can be reduced in order to decrease the plasma density in substrate vicinity and to slow down the growth rate improving the growth control for thin films.

Decreasing the plasma density in substrate vicinity also reduces the sputtering component and the substrate bias may need to be adjusted to maintain the deposition directionality at a target growth rate. The sputtering rate can be measured independently from the film growth rate by switching off one of the gaseous precursors responsible for the film growth while maintaining the same plasma density and substrate bias. The resultant reduction in film thickness per given sputtering duration gives a measure of the sputtering rate for the chosen HDP CVD conditions.

Modifications in HDP equipment directed toward particular applications, providing certain ranges of the substrate proximity to high density plasma, the peak plasma densities, and the chamber pressures, and utilizing various energy coupling schemes may result in different naming and branding of plasma processing tools such as Decoupled Plasma, Remote Plasma, Plasma Immersion, Radial-line slot antenna (RLSA) microwave plasma for surface treatment, implantation, doping, and deposition. The embodiments contemplate the use of these modified and extended plasma processing tools as long as they enable the separate controls for substrate bias and plasma density and operate in a low-pressure regime of below about 1 Torr.

The decreasing dimensions of semiconductor devices can facilitate device performance improvements, such as, e.g., improved switching frequency, decreased power requirements, among others. As a result, semiconductor devices having small transistor minimum pitch sizes can facilitate with device performance improvements. For example, vertical transport field effect transistors (VFET) can have high device performance and circuit density improvements with transistor minimum pitches of less than 50 nm. Integrated circuit (IC) devices may have a plurality of transistors of different geometrical sizes serving different circuit functions.

However, for VFETs, a different pitch of transistor active regions such as fins can be employed to vary transistor size and to tailor transistors for different circuit functions. For instance, some transistors will have 40 nm fin pitch and other transistors will have 80 nm fin pitch. Because the channel is oriented vertically or perpendicular to the substrate in the VFET devices, various structural conductive elements such as the transistor gate and its source/drain need to be separated and electrically isolated in the vertical dimension with horizontal dielectric spacers. Furthermore, because of a variable active area (or fin) pitch in such VFET devices, the gaps between the VFET fins will have a variable size and the horizontal spacers need to be formed inside such variable gaps. For example, a semiconductor device with variable pitch structures can utilize directional HDP CVD process to form horizontal spacers to isolate transistor gates from its source/drain. The deposition of spacer material into these variable size gaps is affected by the gap size. A thin horizontal spacer may result in electrical short between transistor gate and the substrate. A thick horizontal spacer may result in a degraded VFET performance.

Accordingly, a directional HDP-CVD deposition process is used for forming horizontal spacers that includes a deposition component and a sputtering component to generate a bottom-up deposition such that the film deposits more on the horizontal surfaces and less on the vertical surfaces. The balance between the deposition component and the sputtering component enables this directional deposition. Increasing the sputtering component, such as, e.g., through a higher substrate RF bias, results in a higher degree of directionality because the speed of sputtering is different for near vertical and horizontal features, being higher for near vertical features and lower for horizontal features, especially, in the gaps. Sputtering yield or the average number of ejected surface atoms per impinging ion depends on the ion arrival angle being lower for small arrival angles (ions impinging near perpendicular to a surface) and being higher for larger arrival angles (ions impinging at a grazing angle to a surface). It is this property of the sputtering yield that is believed to be enabling the directional property of HDP CVD processes and the resultant bottom up filling of the narrow gaps.

Sputtering rate also depends on the arrival rate or flux of impinging ions and the impinging ion energy. Open or flat areas may have a higher flux of impinging ions than the horizontal surfaces in narrow gaps. This is due to the partial shadowing of ions arriving at steep angles by the sidewalls that surround narrow gaps. Accordingly, the open or flat areas have a higher sputtering rate than the sputtering rate on horizontal surfaces in the narrow gaps. Increasing ion energy may also result in increased sputtering rate on all surfaces. Because the sputtering component contributes the directional property of HDP CVD processes, increasing it leads to a higher degree of directionality or a thicker resultant film formed on horizontal surfaces and a thinner resultant film formed on the sidewalls, however, this also leads to an increased difference in resultant horizontal film thickness in narrow gaps and open or flat areas or, stated differently, to a higher degree of gap loading. This is in contrast to using a slow, surface-chemistry limited deposition process, which results in a conformal film on all surfaces. Unfortunately, conformal films are not suitable for forming horizontal spacers because the film thickness is the same on both horizontal and vertical surfaces.

HDP CVD is used to deposit a non-conformal film suitable for forming horizontal spacer between features with variable gaps. Such non-conformal film is deposited without gap-loading and with a high degree of deposition directionality yielding at least twice thicker film on horizontal surfaces than on near vertical surfaces. Contrary to the conventional wisdom that the sputtering rate controls the gap loading, it has been discovered that a relative thickness of material deposited on the horizontal surfaces of the substrate in each gap including open or flat areas, the gap-loading, is a function of the total flow rate of gaseous-precursors in an HDP-CVD process. Accordingly, the gap loading can be adjusted independent of sputtering and, consequently, the degree of deposition directionality. Thus, by performing HDP CVD with a high total flow rate and with a high sputtering component, the gap-loading is minimized while enabling a highly directional deposition with the grown film on horizontal surfaces being at least twice as thick as the grown film on near vertical surfaces.

Specifically, the sputtering rate or the rate of other directional components can be first adjusted to yield a desired thickness ratio between films formed on horizontal and vertical surfaces and then the total flow rate can be adjusted to minimize the gap loading without sacrificing deposition directionality. In one embodiment, the sputtering rate and the degree of directionality is adjusted by increasing substrate RF bias. In an HDP CVD process, the substrate RF bias from 500 W to about 5000 W or, equivalently, 50V to 500V bias with respect to a plasma potential results in a high degree of deposition directionality yielding at least twice thicker film on horizontal surfaces than on near vertical surfaces. The method of forming horizontal spacers may include an isotropic etch back process to remove the film from vertical surfaces. The isotropic property of such etch back process results in the equal amount of film etching from horizontal and vertical surfaces. Consequently, a thinner film formed on vertical surfaces is highly preferred due to a reduced etch back impact onto the film formed on horizontal surfaces.

Both a higher degree of deposition directionality and reduced gap loading result in an improved thickness uniformity of horizontal spacers, regardless of the gap size including open or flat areas. For example, the horizontal spacer thickness in each gap can be maintained within about a 5% range, regardless of the gap size.

Exemplary applications/uses to which the present invention can be applied include, but are not limited to: VFETs with variable semiconductor fin pitches for use in processors and memory devices.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a cross-sectional view of a semiconductor device having features of variable pitch is depicted in accordance with an illustrative embodiment of the present invention.

According to aspects of an embodiment of the present invention, a semiconductor device 10 is formed with a variable pitch structure. The semiconductor device 10 can include a substrate 100 formed from a semiconducting material, such as, e.g., silicon (Si), or other suitable semiconducting material, including, e.g., group IV materials such as germanium (Ge), Si and silicon carbide (SiC), group III-V materials such as gallium arsenide (GaAs), gallium nitride (GaN) and gallium phosphide (GaP), group II-VI materials such as cadmium sulfide (CdS), group IV-VI material such as lead sulfide (PbS), among others.

Device structures, such as, e.g., fins 110 are formed on the substrate 100. The pitch of the fins 110 can be variable or constant. According to an embodiment, the pitch is a variable pitch. The size of gap 112 is the fin pitch minus the fin 110 width. The minimal designed pitch yields a minimum designed gap size. The gap size can deviate from the minimum designed gap size due to random variations or designed gap/pitch differences. In some embodiments, the designed differences in gap sizes scale as a multiple of minimum designed gap size. Thus, each fin 110 is separated from adjacent fins 110 by a varying gap size, including, e.g., two or more minimal gap sizes. Accordingly, the semiconductor device 10 can include fins 110 separated by a first gap 112, a second gap 114, a third gap 116 and a flat area 118. According to the variation of the pitch, the second gap 114 can be, e.g., larger than the first gap 112 while the third gap 116 is, e.g., larger than the second gap 114. According to aspects of the present invention, the third gap 116 can be, e.g., twice as large as the second gap 114, while the second gap 114 can be about 10% larger than the first gap 112 due to an uncontrollable pitch variation known as pitch walking. While semiconductor pitches can scale as 2×, 3×, 4×, etc., larger than the minimum (1×) pitch size, pitch walking introduces about 10% variation within pitch sizes that supposed to be the same and increasing variability is gap sizes across a semiconductor device. For example, gaps 112 and 114 are supposed to be identical (1× pitch) but show variability in gap size due to inherent lithography (overlay) errors. Designed variation in the gap size shown schematically as 116 versus 112/114 may also arise from the process of erasing certain fins to allow for a larger separation between devices that carry different electrical functions.

The flat area 118 is an area on the substrate 100 outside of an active region that includes the features, such as the fins 110, and is large enough to undergo deposition as if it is of infinite length. An area would be considered flat or open if its size is substantially large compare to surrounding fin 110 height, e.g. more than 5 times larger than the fin 110 height. For example, the flat area 118 experiences deposition as if the substrate 100 was entirely devoid of fins 110. The flat area 118 can be, e.g., an end of an array on the semiconductor device 10, or a large blank area of the substrate 100, such as a pad.

The pitches of the fins 110 and the resulting gaps therebetween on the substrate 100 can be selected according to a type of the semiconductor device 10. For example, the semiconductor device 10 can be a single chip including multiple devices, each device having a different pitch between fins 110. In such a device, the fins 110 will have multiple regions with a corresponding pitch for each region. Other forms of variable pitch devices are contemplated, including, e.g., memory devices and processor devices having variable pitch fins.

The fins 110 can be formed on the substrate 100 by, e.g., etching, including anisotropic etching such as reactive ion etching (RIE), through a mask 111 into the substrate 100 to form integral fins 110. However, other suitable methods for forming fins 110 may be used, such as, e.g., one or more steps of deposition, lithography and/or etching, or combinations thereof.

The substrate 100 may contain doped regions around the base of each fin 110 (not shown for clarity). Such doped regions may form conductive source/drain structures of VFETs. Because these doped structures are located at the base of VFET fins they are referred to as bottom sources/drains. The doped regions can be of different dopant polarity such as n-type and p-type suitable for nVFET and pVFET sources/drains, respectively. The doped regions can be formed either prior or after forming fins 110 by suitable doping techniques such as ion or plasma implantation, in-situ doped gas phase epitaxy, or combination thereof. The doped regions of different polarity can be formed by patterning techniques where portions of substrate 100 are blocked by a block mask while other portions of substrate 100 are exposed for performing doping. The dopants can be activated by a suitable thermal treatment such as rapid thermal annealing, laser annealing, flash annealing, or combinations thereof.

Fins 110 located at the boundary of nVFETs and pVFETs can be erased using patterning and etching techniques. Erased fins provide larger room between transistors of different polarity but also lead to a larger gap between nVFET and pVFET fins.

The substrate 100 may also contain other useful structures (not shown for clarity) such as isolation regions, dopant wells, buried interconnects, capacitors, and other useful devices. These elements can be formed prior to forming fin 110 by known methods.

Figure 2:
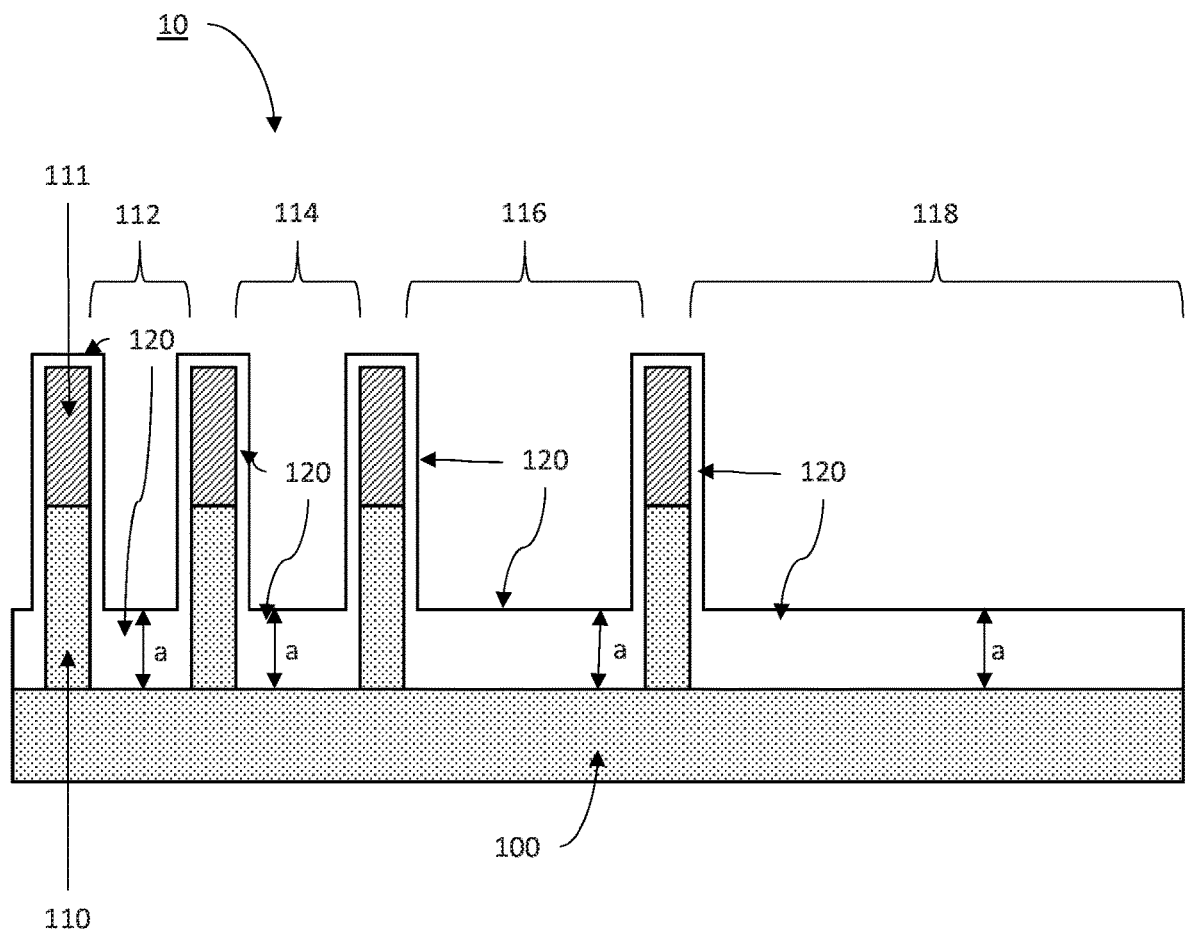
FIG. 2 is a cross-sectional view showing a semiconductor device with a directionally deposited thin film formed in the gaps between variable pitch features and open or flat areas, in accordance with an embodiment of the present invention.

Referring now to FIG. 2, a cross-sectional view of a semiconductor device with a directionally deposited thin film formed in the gaps between variable pitch features is depicted in accordance with an embodiment of the present invention.

The semiconductor device 10 according to aspects of the present invention can be configured such as, e.g., variable pitch transistors for processors, or multiple devices formed on a single wafer with each device using a different pitch or gap in between such devices. Thus, insulating materials may be provided between structures such as the fins 110 to provide improved electrical isolation of each fin 110 and between the substrate 100 and gate structures, as will be described below. The insulating materials can be provided as, e.g., horizontal spacers using a spacer material 120, including suitable insulating materials, such as, e.g., silicon dioxide ($SiO_2$), silicon nitride (SiN), other suitable oxide or nitride compound. Thus, a layer of spacer material 120 is provided at a uniform thickness on horizontal surfaces between each fin 110 in the gaps 112, 114 and 116 and in the flat area 118.

The spacer material 120 on horizontal surfaces between fins 110 is uniform in thickness so that subsequent process is made more predictable and reliable, thus ensuring higher device yields. However, a conformal deposition technique will result in the same or similar amounts of materials formed on vertical and horizontal surfaces, such as, e.g., sidewalls of the fins 110 as well as on a bottom of a gap, such as, e.g., a bottom of the first gap 112, second gap 114 or third gap 116. Therefore, additional processing would be employed to remove the vertical portions of a conformally deposited layer, while preserving the bottom part of the film. Absence of etching techniques that can selectively remove the same spacer material from vertical surfaces while leaving it on horizontal surfaces prohibit forming horizontal spacers from conformal films without having additional steps directed towards modifying spacer material. As a result, conformal deposition techniques may involve many additional steps while also being less reliable, which in turn increase costs as well as decreases the quality and uniformity of the horizontal portions.

Thus, aspects of the present invention implement a simple process of forming a bottom, horizontal spacer. The process can include an uniform, anisotropic or directional deposition process that deposits spacer film material 120 on horizontal surfaces, with very little spacer material 120 deposited on vertical surfaces. An isotropic material etch-back can be performed (as will be described in greater detail below with reference to FIG. 3) to remove the spacer material 120 from the vertical surfaces.

To form a uniform film with the spacer material 120 on horizontal surfaces, a non-conformal, bottom-up deposition process is employed. For example, the spacer material 120 can be deposited using, e.g., high density plasma (HDP) chemical vapor deposition (CVD), or other suitable non-conformal bottom-up technique such as, e.g., physical vapor deposition (PVD) or spin-on deposition. The bottom-up HDP CVD can be enabled by increased deposition directionality. The degree of deposition directionality is assessed by the resultant film thickness ratio of film 120 deposited on vertical sidewalls to film 120 deposited on horizontal surfaces. The ratio of less than half is highly desirable. To enable a suitable deposition directionality the sputtering rate and the deposition rate of the HDP CVD process can be adjusted. To facilitate the uniformity of the spacer material 120 on horizontal surfaces in each of the gaps 112, 114 and 116, as well as the flat area 118, the total gas flow rate of the HDP CVD process can be adjusted to promote uniformity regardless of degree of directionality, gap size, aspect ratio, and profile of the gaps 112, 114 and 116 and the flat area 118. For example, the unexpected result of increasing the total flow rate of gaseous precursors during HDP CVD decreases gap-loading in smaller gap sizes. Similarly, the unexpected result of increasing the total flow rate of gaseous precursors during HDP CVD increases the sputtering rate promoting deposition directionality. Here, gap-loading is a function of a thickness of spacer material 120 on horizontal surface in a gap 112, 114, or 116 and a thickness of the spacer material 120 in the flat area 118. For example, gap-loading may be determined according to the following equation:

$$\text{Gap} - \text{Loading} = \left(1 - \text{mod}\left(\frac{t_f - t_g}{t_g}\right)\right) * 100, \quad \text{Equation 1}$$

where $t_g$ is a thickness of spacer material 120 on a horizontal surface in a given gap, and $t_f$ is a thickness of spacer material 120 in the flat area 118.

Thus, aspects of the present invention include directionally depositing the insulating material 120 to form a horizontal spacer at a uniform thickness on horizontal surfaces across the device 10, regardless of gap size and aspect ratio, by using a relatively high gaseous precursor flow rate and high sputtering rate. For example, aspects of the present invention include selecting HDP CVD rates that results in a minimal gap-loading in the first gap 114.

Because using the high gaseous precursor flow rate improves thickness uniformity of film formed on horizontal surfaces in a gap of any size, the flat area 118, second gap 112 and third gap 116 will have spacer material 120 deposited to a same thickness on the surface of the substrate 100 as in the first gap 114.

While the deposition process is directional, thus depositing spacer material 120 on horizontal surfaces in the gaps 112, 114, 116 and the flat area 120, some spacer material 120 may form on the vertical sidewalls and tops of the fins 110. However, due to the directional nature of, e.g., HDP CVD, there will be a high degree of directionality of the deposition, resulting in relatively little deposition on vertical surfaces. For example, for fins 110 with a height in the range of between about 50 nanometers (nm) and about 70 nm, there may be about 6 nm or less of spacer material 120 formed on vertical surfaces. Meanwhile, thickness a can be in a range of between about 5 nm and about 20 nm. In this example, the degree of directionality as measured by the resultant thickness ratio of film 120 deposited on vertical sidewalls to film 120 deposited on horizontal surfaces is less than one third.

While a deposition process can be configured to maintain spacer uniformity in gaps of any size, gap sizes can be in a range of between about 20 nm and about 100 nm. Other gap sizes are contemplated.

Figure 3:
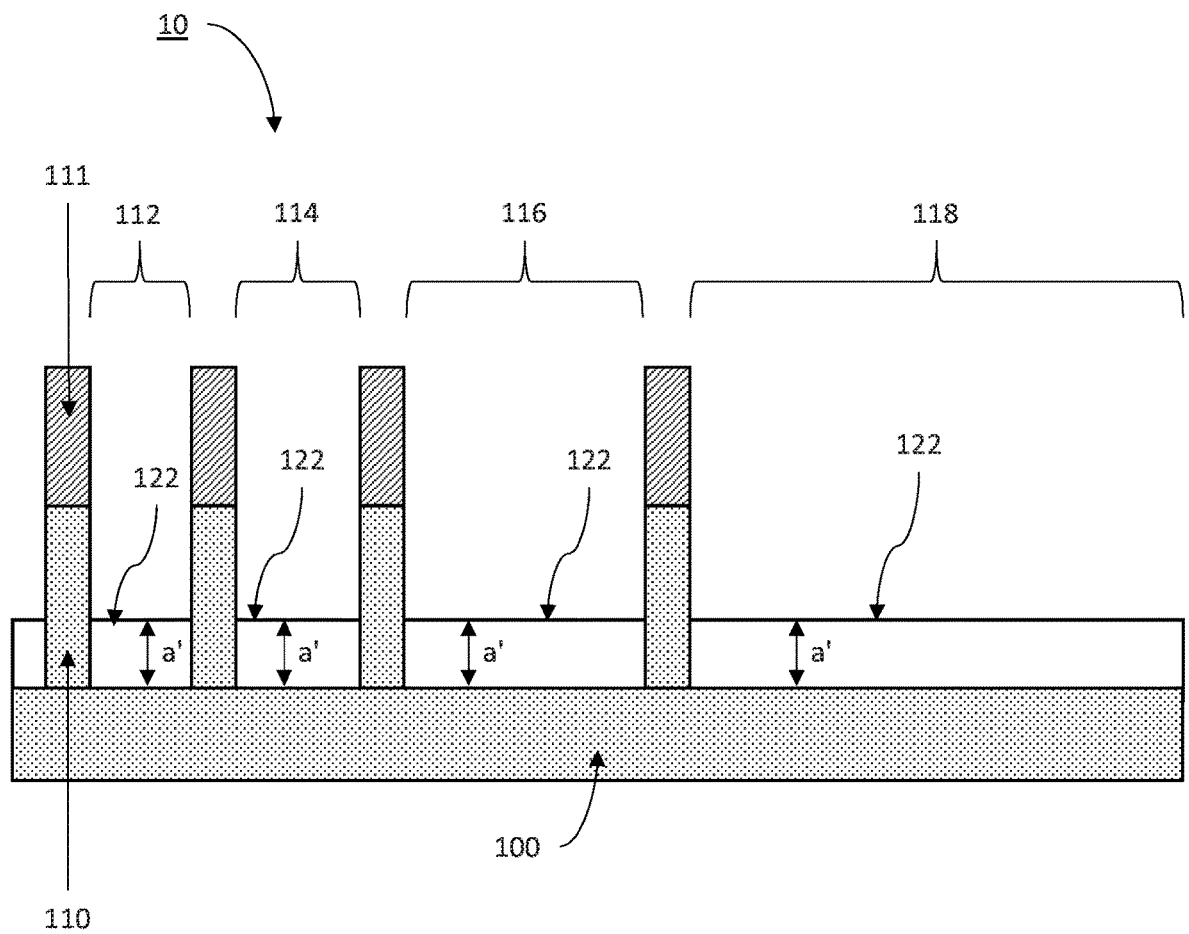
FIG. 3 is a cross-sectional view showing a semiconductor device with a directionally deposited thin film isotropically etched to form uniform horizontal spacers in the gaps between variable pitch features and open or flat areas, in accordance with an embodiment of the present invention.

Referring now to FIG. 3, a cross-sectional view of a semiconductor device with a directionally deposited thin film selectively etched to form uniform horizontal spacers in the gaps between variable pitch features is depicted in accordance with an embodiment of the present invention.

As discussed above, while the deposition process is directional, thus depositing spacer material 120 on horizontal surfaces, some spacer material 120 may form on the vertical sidewalls of the fins 110. Directional deposition techniques, such as HDP CVD, PVD and others, can have a ratio of material thickness deposited on a vertical sidewall to material thickness deposited on the bottom of the gap in a range from about 1/3 to about 1/10. According to aspects of the present invention, the spacer material 120 on vertical sidewalls is undesirable, and can be removed to produce a truly horizontal spacer. Therefore, an isotropic etch process is used to remove spacer material 120 from vertical sidewalls. Because isotropic etching removes material in all directions, this etch process will also remove a portion of spacer material 120 from horizontal surfaces. Therefore, the thickness of spacer film 120 on horizontal surfaces will be decreased to a thickness a' where the difference between a and a' is approximately equal to a thickness of the spacer material 120 on the sidewalls of the fins 110. A small difference between a and a' ensures that the etch process has a small uniformity impact on the spacer 122 thickness. For example, 5% variability in etch rate will result in 1.7% spacer 122 thickness variability if a'/a is one third or less. Accordingly, a suitable isotropic etch process can be used without much impact onto spacer thickness variability, such as, e.g., wet etching or gaseous or dry etching, among others.

After forming horizontal spacer 122, an optional thermal treatment can be perform to diffuse the dopants from substrate 100 up the fin 110 toward the upper surface of spacer 122. Accordingly, the bottom source/drain regions of respective VFETs are extended through fin 110 to the upper surface of spacer 122. In one embodiment, such thermal treatment is rapid thermal anneal conducted at a temperature of from about 950 C to about 1050 C for a duration of several seconds. The spacer thickness a' defines the relative position of bottom source/drain junction with respect to the upper surface of horizontal spacer 122 and the gate structure to be formed over the horizontal spacer 122.

Figure 4:
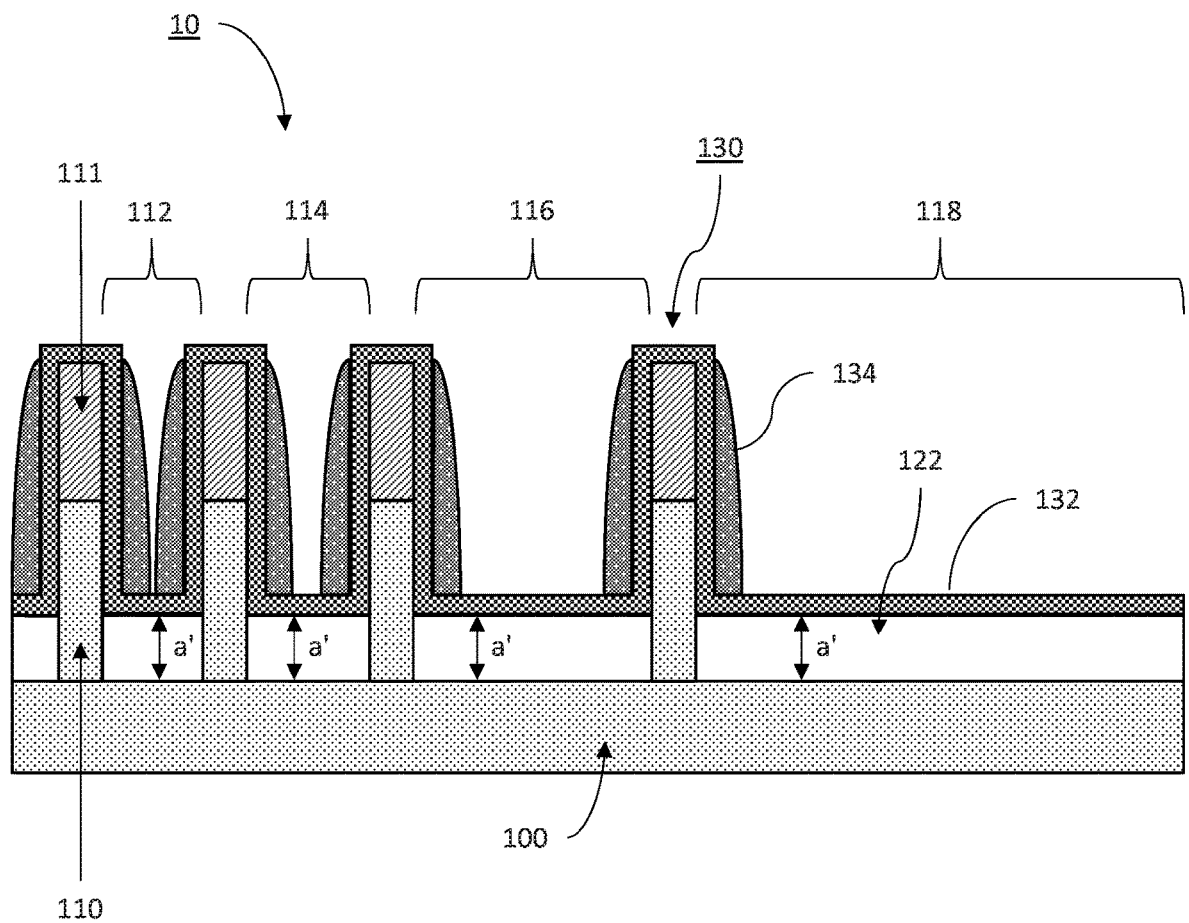
FIG. 4 is a cross-sectional view showing a semiconductor device with uniform horizontal spacers in the gaps between variable pitch features and open or flat areas and a gate dielectric and gate conductor formed on the fins to form transistors, in accordance with an embodiment of the present invention.

Referring now to FIG. 4, a cross-sectional view of a variable pitch/gap semiconductor device with uniform horizontal spacers having a gate structure formed across the semiconductor device is depicted in accordance with an embodiment of the present invention.

The device 10 can be used for variable pitch semiconductor devices or variable gap between the features of semiconductor devices. For example, the device 10 can be, e.g., a variable pitch/gap device using vertical field effect transistors (vFETs). Accordingly, a gate structure 130 is formed on the fins 110 to form vFETs for the device 10. The gate structure 130 can include, e.g., a gate dielectric 132 and a gate conductor 134. Thus, the gate structure 130 is formed on each fin 110 sidewall and over the horizontal spacers 122. The gate conductor 134 is isolated from the fin 110 by the gate dielectric 132. This allows for controlling free electrical charge in the fin 110 by applying voltage to the gate conductor 134. Because the horizontal spacers 122 are formed in an insulating material, e.g., silicon dioxide ($SiO_2$), the gate conductor 134 is isolated from the substrate 100 and any conductive source/drain regions formed therein, thus improving the performance and reliability of the device 10. Because the horizontal spacers 122 are of uniform thickness over the surface of the substrate 100, the position of bottom source/drain junction with respect to the gate structures 130 formed over horizontal spacers 122 is the same for each fin 110 providing similar electrical characteristics for each VFET. The performance of VFET is very sensitive to the relative position of bottom source/drain junction with respect to the gate structure 130: any geometrical overlap between source/drain and the gate degrades transistor short channel characteristics and shifts its threshold voltage while any geometrical underlap between source/drain and the gate structure degrades (increases) transistor "on" resistance, $R_{on}$. For example, spacer 122 thickness variation by more than 5% results in transistor threshold voltage shift by more than 20 mV and transistor $R_{on}$ increase by more than 5%. Thus, performance and reliability of the vFETs are ensured by uniform horizontal spacers 122.

Over the fins 110 and the uniform horizontal spacers 122, the gate dielectric 132 can be conformally deposited. Thus, the gate dielectric 132 can be deposited using, e.g., atomic layer deposition (ALD), CVD, or other suitable conformal deposition process. The gate dielectric 132 can include a suitable dielectric material, such as, e.g., oxides and nitrides, including SiO$_2$, SiN, hafnium oxide (HfO$_2$). aluminum oxide (Al$_2$O$_3$), or other high-K material.

The gate conductors 134 can then be formed. The gate conductors include the work function materials that can be disposed over the gate dielectric 132. The type of work function materials depends on the type of transistor and can differ between the nVFET and pVFET devices. pVFET work function materials include compositions such as ruthenium, palladium, platinum, cobalt, nickel, and conductive metal oxides or nitrides such titanium nitride, or any combination thereof. nVFET work function materials include compositions such as hafnium, zirconium, titanium, tantalum, aluminum, metal carbides and nitrides (e.g., titanium nitride, tantalum nitride, titanium carbide, tantalum carbide), aluminides, or any combination thereof. The gate conductor 134 may also include conductive metals such as aluminum, tungsten, cobalt, titanium, tantalum, ruthenium or any combination thereof. The work function materials and conductive metals can be deposited by a suitable deposition process such as ALD, CVD, PECVD, PVD, plating, thermal or e-beam evaporation, and sputtering, among others. The deposited conductive layer can then be etched using a directional reactive ion etch (RIE) to form the gate conductors 134 in the form of vertical spacers adjacent to fin 110 sidewalls, as shown in FIG. 4. nVFET and pVFET gate conductors 134 can be formed sequentially with suitable patterning techniques.

Subsequent processing can then be performed to complete the vFETs. Such processing can include, e.g., forming an interlevel dielectric to isolate and encapsulate gate conductors, forming additional pair of horizontal spacers over the gate structure 130 and the interlevel dielectric, forming top source and drain regions atop of fin 110 and above the gate structure 130, forming electrical contacts to the bottom source/drain, top source/drain, and gate conductor 134. The semiconductor device 10 can then be wired using an interconnect network to integrated circuits as, e.g., processing devices or memory devices.

Figure 5:
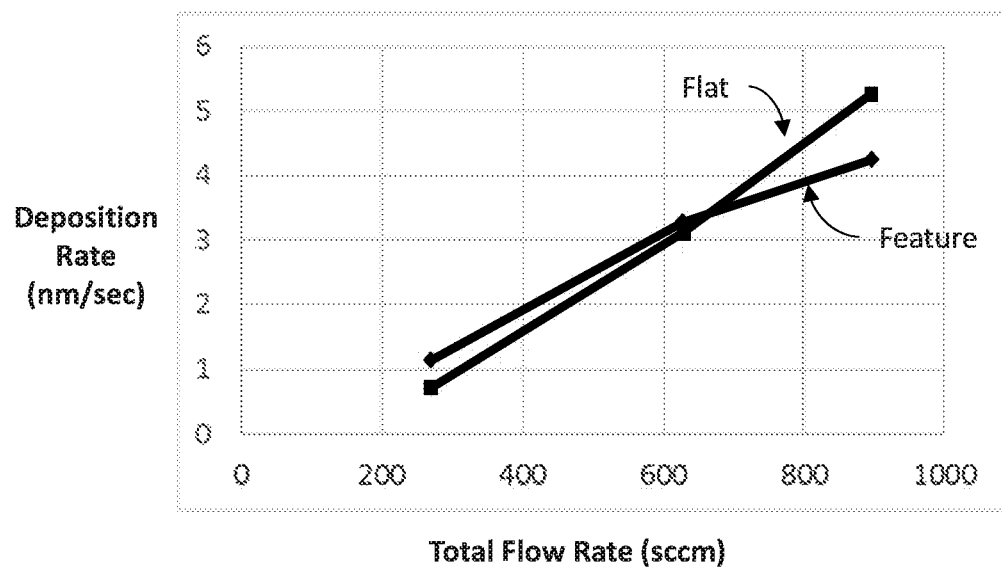
FIG. 5 is a graphical representation showing a deposition rate as a function of total gas flow rate for forming uniform horizontal spacers on a variable pitch/gap semiconductor device, in accordance with an embodiment of the present invention.

Referring now to FIG. 5, a graphical representation of deposition rate as a function of total gas flow rate for forming uniform horizontal spacers on a variable pitch/gap semiconductor device is depicted in accordance with an embodiment of the present invention.

According to aspects of the present invention, deposition rate has been tested in relation to total flow rate of gaseous precursors during high density plasma (HDP) chemical vapor deposition (CVD). A relationship between deposition rate and total gas flow rate has been tested for flat areas, such as the flat area 118, and for features, such as gap 112, 114 or 116. In a total gas flow rate range of about 250 standard cubic centimeters per minute (sccm) to about 900 sccm, it has been found that a deposition rate for flat areas is occurs at a rate in the range of between about 0.7 nm/s and about 5.2 nm/s. Thus, a greater total gas flow rate results in an increase in deposition rate, both in flat areas and in a feature (bottom horizontal surface of the gap between fins) areas. For example, for a total flow rate in the range between about 250 sccm and about 900 sccm, deposition occurs at a rate of between about 1 nm/s and about 4.2 nm/s. However, while the average response of deposition rates to total gas flow rates are somewhat similar for flat and feature areas, the slopes of the rate versus the total gas flow are different with feature area deposition rates being slower at higher total gas flows. The two curves intersect at about 620 sccm of total gas flow rate which gives a desired zero gap loading (no difference between the flat area and the feature) at a deposition rate of about 3.5 nm/sec. Thus, unexpectedly, film thickness on bottom horizontal surfaces, such as, e.g., along a surface of a substrate, in gaps has been found to increase much slower than on a flat area after an inflection point in the total gas flow rate above about 500 sccm. In addition to the gap-dependence of regular sputtering and radical-assisted deposition components, the discrepancy between gaps and flat areas may be due to fewer metastable hydrogen radicals present at higher gas velocities. Metastable hydrogen radicals can suppress growth rates in wide gaps and open areas faster than in relatively narrower gaps. So increasing total gas flow rates to reduce the metastable hydrogen radicals can offset the discrepancy between growth rates in gaps of different size caused by other components such as sputtering and radical-assisted deposition.

Figure 6:
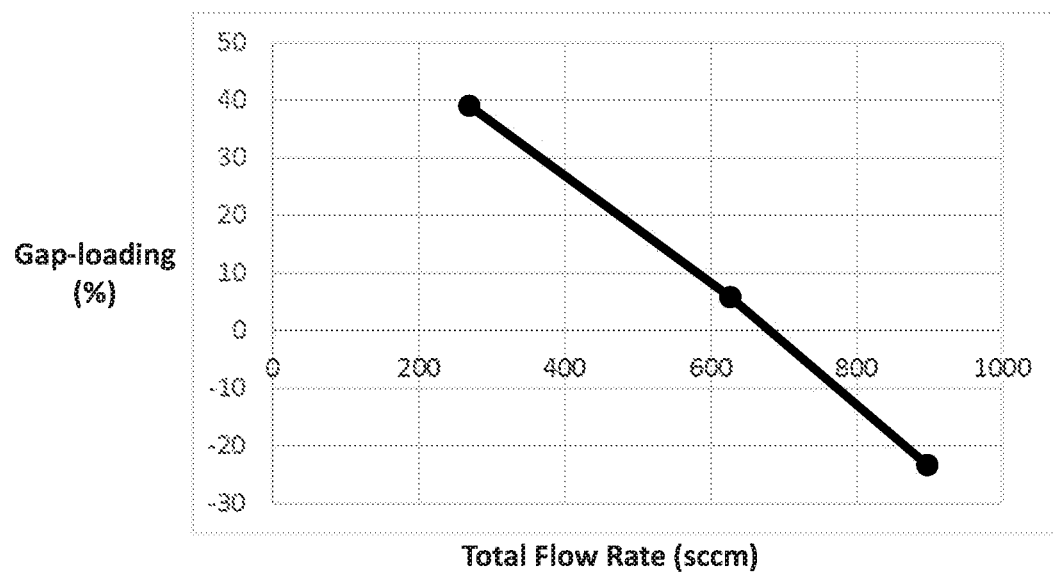
FIG. 6 is a graphical representation showing a gap-loading as a function of total gas flow rate for forming uniform horizontal spacers on a variable pitch/gap semiconductor device, in accordance with an embodiment of the present invention.

Referring now to FIG. 6, a graphical representation of gap-loading as a function of total gas flow rate for forming uniform horizontal spacers on a variable pitch/gap semiconductor device is depicted in accordance with an embodiment of the present invention.

Gap-loading has been assessed against total gas flow rate in feature areas, such as, e.g., gaps 112, 114 or 116. In particular, gap-loading as a percentage has been plotted against varying total gas flow rates. As a discussed above, gap-loading is determined according to equation 1, which is a function of a deposited material thickness in a flat area and a measure area. The gap-loading has been found to decrease initially with increasing total gas flow providing near zero gap-loading at an optimum total gas flow rate. In one embodiment, the gap-loading in a feature area decreases to approximately 0% at the optimum total gas flow of about 620 sccm. Stated differently, increasing total flow rate from about 250 sccm to about 650 sccm results in gap loading decreasing from about 40% to about 0% corresponding to the optimum total flow of about 650 sccm. Increasing the total flow rate beyond about 650 sccm continues to decrease gap loading below 0%, thus resulting in a corresponding increase in absolute gap loading, such as, e.g., increasing total flow rate form about 650 sccm to about 900 sccm results in gap loading decreasing from about 0% to about −25% and absolute gap loading increasing from about 0% to about 25%. Thus, unexpectedly, it has been found that as total gas flow rate increases, the gap-loading decreases to an optimal point after which it starts growing again.

Figure 7:
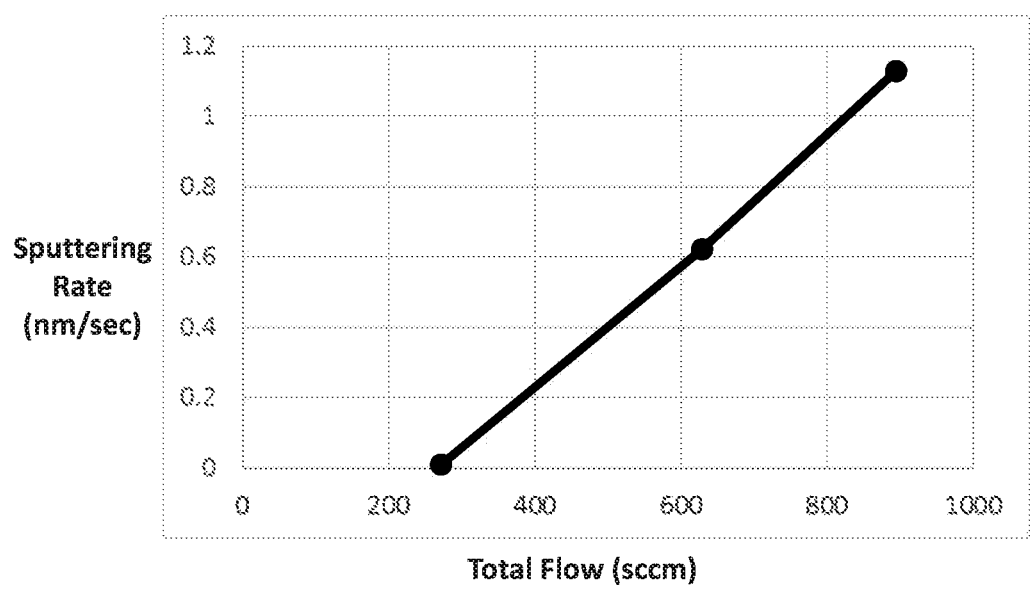
FIG. 7 is a graphical representation showing a sputtering rate as a function of total gas flow rate for forming uniform horizontal spacers on a variable pitch/gap semiconductor device, in accordance with an embodiment of the present invention.

Referring now to FIG. 7, a graphical representation of sputtering rate as a function of total gas flow rate for forming uniform horizontal spacers on a variable pitch/gap semiconductor device is depicted in accordance with an embodiment of the present invention.

According to aspects of the present invention, sputtering rate has been tested in relation to total gas flow rate of gaseous precursors during HDP CVD. The sputtering rate contributes to the degree of deposition directionality and decreasing it could reduce the HDP CVD directionality negatively affecting forming horizontal spacers. A relationship between sputtering rate and total gas flow rate has been tested on blanket films as alluded above. In a total flow rate range of about 250 sccm to about 900 sccm, it has been found that a sputtering rate increases with total gas flow rate. In particular, for a total gas flow rate in the range between about 250 sccm and about 900 sccm sputtering occurs at a rate of between about 0 nm/s and about 1.2 nm/s. Thus, a greater total flow rate also results in a greater sputtering rate. Thus, contrary to expectations, the gap-loading reduction occurs at an increased sputtering rate maintaining or improving deposition directionality.

Combined with the tests regarding gap-loading, deposition rate, and sputtering rate in relation to total gas flow rate, it is theorized that in addition to regular process components such as radical-assisted deposition and sputtering, there is another process component that also exhibits gap-loading phenomena but does so in an opposite manner and independent of other components. It has been further theorized that such additional component may be due to the presence of metastable hydrogen radicals that suppress growth rates to a larger extent in wide gaps and open areas and to a lesser extent in narrow gaps. The greater total gas flow rates decrease metastable hydrogen radicals. Because metastable hydrogen radicals will result in lower growth rates in larger gaps and open areas, decreasing the metastable hydrogen radicals by increasing total gas flow rate will inhibit excess deposition in larger gap areas. Thus, uniformity across all gap sizes can be improved independent of deposition directionality.

Referring now to FIG. 8, a block/flow diagram of a system/method for forming uniform thickness horizontal spacers in gaps of a variable pitch/gap semiconductor device is depicted in accordance with an embodiment of the present invention.

At block 1201, form a plurality of gaps of variable size between device features, each of the gaps including vertical sidewalls perpendicular to a substrate surface and a horizontal surface parallel to the substrate surface.

At block 1202, directionally deposit spacer material concurrently on the horizontal surface in each gap and in a flat area using a total flow rate of gaseous precursors that minimizes gap-loading in a smallest gap compared to the flat area such that the spacer material is deposited on the substrate surface in each gap and in the flat area to a uniform thickness.

At block 1203, isotropically etch the spacer material to remove the spacer material from the sidewalls.

The spacer material is an insulating material. Thus, aspects of the present invention include removing the spacer material from every surface except the horizontal surface on the substrate between the fins. Accordingly, an isotropic etch process can be employed that will remove spacer material from every surface. Thus, the spacer material will be removed from the sidewalls of the fins as well as tops of the fins. However, according to aspects of the present invention, the thickness on the horizontal surfaces is thicker than on the sidewalls and tops of the fins due to directionally depositing the spacer material as described above. Therefore, while the thickness on the substrate surface is reduced, it is only trivially reduced and thickness uniformity is maintained in each gap of the device. Thus, a suitable isotropic etch process can be used, including, e.g., wet etching or gas/dry etching.

At block 1204, form gate structures on the horizontal spacer and sides of fins to form at least one transistor.

The gate structure can include a gate dielectric is formed conformally over the spacer material and the fins. Over the gate dielectric, a gate conductor is formed on sides of each fin to form vertical FETs. Thus, a plurality of vertical field effect transistors are formed corresponding to each fin.

Having described preferred embodiments of a system and method for a uniform horizontal spacer (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, the method comprising:
   forming a plurality of gaps of variable size between device features, each of the gaps including vertical sidewalls perpendicular to a substrate surface and a horizontal surface parallel to the substrate surface; and
   directionally depositing a spacer material concurrently on the horizontal surface in each gap and in a flat area using a total flow rate of gaseous precursors that minimizes gap-loading in a smallest gap compared to the flat area such that the spacer material is deposited on the substrate surface in each gap and in the flat area to a uniform thickness, wherein the uniform thickness is achieved by varying the total flow rate of the gaseous precursors, while maintaining chamber pressure.

2. The method as recited in claim 1, wherein directionally depositing the spacer material includes depositing the spacer material using a radio frequency (RF) bias applied to the substrate relative to a plasma potential.

3. The method as recited in claim 2, wherein the RF bias in a range of about 500 Watts (W) to about 5000 W.

4. The method as recited in claim 1, further including depositing the spacer material with high density plasma (HDP) chemical vapor deposition (CVD), wherein the chamber pressure is measured and a valve is adjusted to maintain the chamber pressure.

5. The method as recited in claim 1, wherein directionally depositing the spacer material includes a ratio of deposited thickness of the spacer material on the vertical sidewalls compared to the horizontal surface of less than one half.

6. The method as recited in claim 1, further including isotropically etching the spacer material to remove the spacer material from vertical sidewalls.

7. The method as recited in claim 1, wherein at least one of the gaps has a size that is at least 20% larger than a size of at least one other gap.

8. The method as recited in claim 1, wherein the spacer material is selected from the group consisting of silicon oxide, silicon nitride, a doped oxide and a doped nitride.

9. The method as recited in claim 1, wherein the spacer material has a thickness in each of the gaps that within 5% of a thickness in each other of the gaps.

10. The method as recited in claim 4, wherein the flow rate of gaseous precursors is in a range of between about 600 and about 750 standard cubic centimeters per minute (sccm).

11. A method for forming vertical field effect transistors, the method comprising:
    forming a plurality of fins on a substrate such that gaps are formed between each fin, the gaps having varying sizes;
    directionally depositing a spacer material concurrently on a surface of the substrate in each gap and in a flat area using a non-conformal bottom-up deposition using a flow rate of gaseous precursors that minimizes gap-loading in the smallest gap compared to the flat area such that the spacer material is deposited on the surface in each gap and in the flat area to a uniform thickness, wherein the uniform thickness is achieved by varying the total flow rate of the gaseous precursors, while maintaining a chamber pressure in a range of about 5 mTorr to about 100 mTorr for varying precursor gas flow rates;

isotropically etching the spacer material from vertical sidewalls of the fins, wherein the vertical sidewalls are perpendicular to the surface of the substrate; and forming a vertical gate structure on each of the fins to form at least one vertical transistor.

12. The method as recited in claim 11, further including depositing the spacer material with high density plasma (HDP) chemical vapor deposition (CVD), wherein the chamber pressure is measured and a valve to a pump is adjusted to maintain the chamber pressure.

13. The method as recited in claim 11, wherein directionally depositing the spacer material includes depositing the spacer material using a radio frequency (RF) bias applied to the substrate relative to a plasma potential in a range of about 500 Watts (W) to about 5000 W.

14. The method as recited in claim 11, wherein directionally depositing spacer material includes a ratio of deposited thickness of the spacer material on the vertical sidewalls compared to the horizontal surface of less than one half.

15. The method as recited in claim 11, wherein at least one of the gaps has a size that is at least 20% larger than a size of at least one other gap.

16. The method as recited in claim 11, wherein the spacer material is selected from the group consisting of silicon oxide, silicon nitride, a doped oxide and a doped nitride.

17. The method as recited in claim 11, wherein the uniformly deposited spacer material has a thickness in each of the gaps that within 5% of a thickness in each other of the gaps.

* * * * *